United States Patent [19]

Tucker et al.

[11] Patent Number: 4,764,717
[45] Date of Patent: Aug. 16, 1988

[54] TOUCH-SENSITIVE POTENTIOMETER FOR OPERATOR CONTROL PANEL

[75] Inventors: Terry L. Tucker, Boca Raton; Michael L. Orsburn, Cooper City, both of Fla.

[73] Assignee: Utah Scientific Advanced Development Center, Inc., Ft. Lauderdale, Fla.

[21] Appl. No.: 923,326

[22] Filed: Oct. 27, 1986

[51] Int. Cl.⁴ .............................................. H03H 1/00
[52] U.S. Cl. .................................. 323/364; 323/354; 323/904
[58] Field of Search ............... 323/352, 353, 354, 364, 323/369, 370, 904; 338/99, 114

[56] References Cited

U.S. PATENT DOCUMENTS

| | | |
|---|---|---|
| 2,244,958 | 6/1941 | Moross . |
| 2,554,811 | 5/1951 | Bromberg et al. . |
| 2,660,613 | 2/1950 | Young, Jr. . |
| 2,697,218 | 12/1954 | Glenny . |
| 2,876,318 | 3/1959 | Stratton . |
| 2,894,236 | 7/1959 | Jopson . |
| 2,929,258 | 3/1960 | Mackway . |
| 2,954,707 | 10/1960 | Kalous . |
| 3,054,297 | 9/1962 | Wells et al. . |
| 3,134,086 | 5/1964 | Caddock et al. . |
| 3,428,887 | 2/1969 | Miller . |
| 3,895,288 | 7/1975 | Lampen et al. ............... 323/904 X |
| 3,919,596 | 11/1975 | Bellis ............................ 323/904 X |
| 4,047,145 | 9/1977 | Schwehr . |
| 4,096,523 | 6/1978 | Belmares-Sarabia et al. . |
| 4,123,740 | 10/1978 | Palmer et al. . |
| 4,168,468 | 9/1979 | Mabuchi et al. . |
| 4,246,533 | 1/1981 | Chiang ......................... 323/904 X |
| 4,258,100 | 3/1981 | Fujitani et al. ............... 338/114 X |
| 4,597,006 | 6/1986 | Orsburn . |
| 4,615,252 | 10/1986 | Yamauchi et al. ............ 338/99 X |

OTHER PUBLICATIONS

J. T. Kolias et al., "Touch Sensitive Capacity Switch Circuit", IBM Technical Disclosure Bulletin, vol. 14, No. 11, Apr. 1972, p. 345.
TK-47B, RCA Corporation, Jun. 1983.
TK-48, RCA Corporation, Jun. 1983.
Smart Remote Control Unit Display Module, RCA Corporation, Mar. 1983.
Smart Remote Control Unit Switch Module, RCA Corporation, Dec. 1984.
Smart Remote Control Unit Computer Module, RCA Corporation, Dec. 1984.
Smart Remote Control Unit Description Operation Maintenance, RCA Corporation, Aug. 1983.
RCA Multiple Event Programmer for TC-29C Telecine Camera, Type PA-3000, RCA Corporation (Date unknown).

Primary Examiner—Peter S. Wong
Attorney, Agent, or Firm—Jones, Askew & Lunsford

[57] ABSTRACT

A touch-sensitive potentiometer for an operator control panel. A linear strip having a polymeric resistor film is provided as an operator actuatable control. The stray capacitance of an operator's body, when the operator touches the strip along its length, unbalances a transformer bridge and provides a voltage proportional to the position of the operator's finger along the length of the polymeric resistor. The potentiometer is suitable for use in any operator control environment where it is desired to (1) rapidly and quickly approach a control range without multiple turns required by optical position encoder-type control devices, or (2) rapidly and quickly be reset to a null or zero state upon the completion of a control in preparation for a subsequent control.

8 Claims, 2 Drawing Sheets

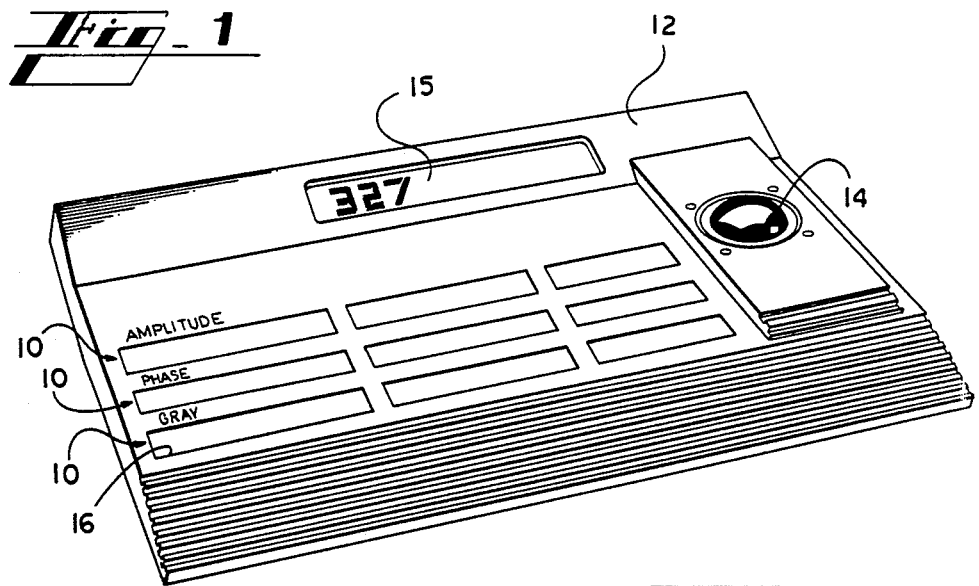
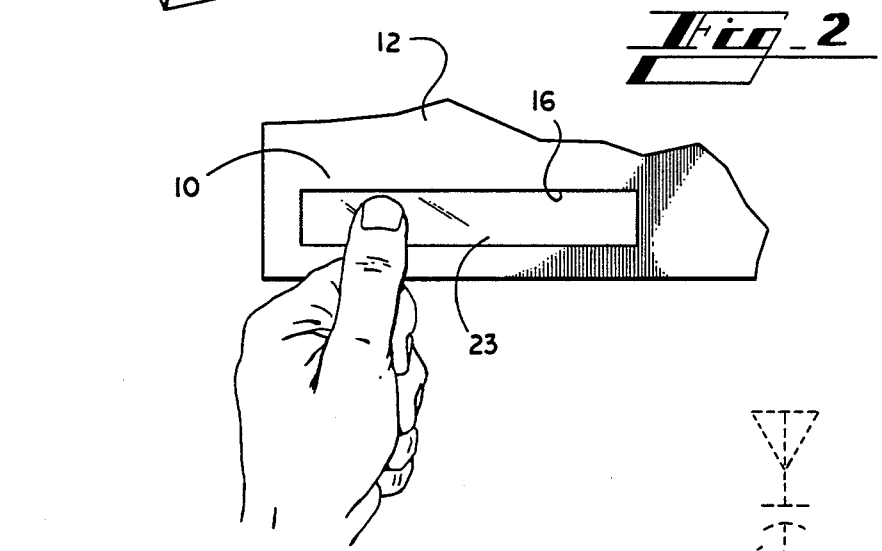
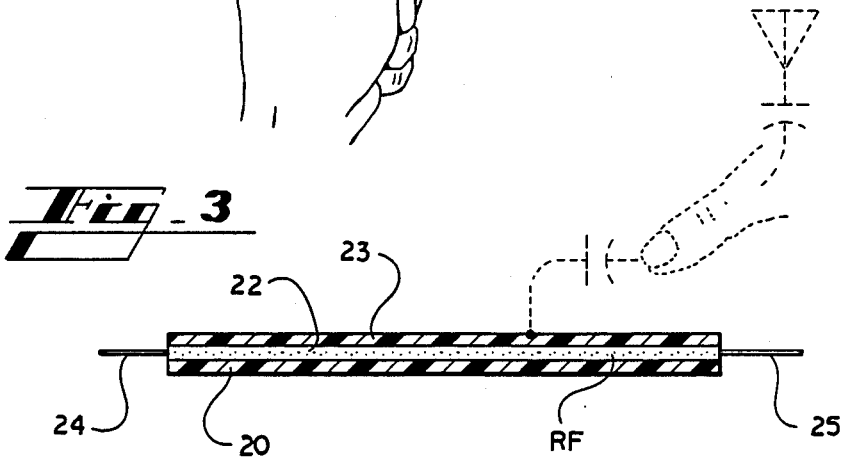

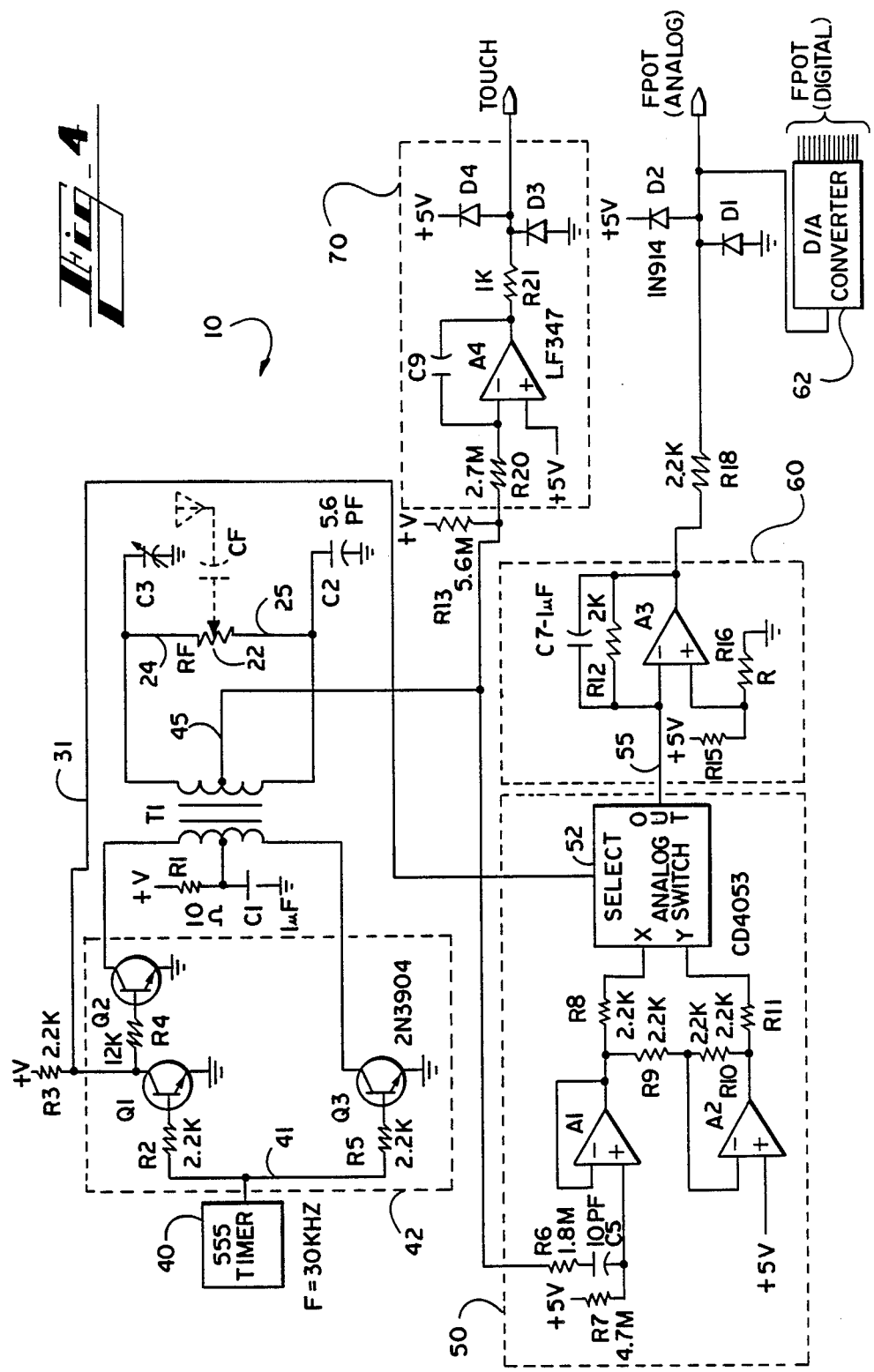

TOUCH-SENSITIVE POTENTIOMETER FOR OPERATOR CONTROL PANEL

TECHNICAL FIELD

The present invention generally relates to touch-sensitive operator controls, and more particularly relates to a touch-sensitive control potentiometer for use in an operator control panel wherein the position of an operator's finger with respect to a longitudinally-extending touch surface produces a signal indicative that a particular potentiometer has been activated and voltage corresponding to the relative position of the finger on the surface.

BACKGROUND OF THE INVENTION

Operator control panels including potentiometers are widely used devices for allowing operator interaction with some type of system which is electronically or computer controlled. One typical application relates to a scene by scene color corrector wherein video parameters of video signals are adjusted. There is often a need in such systems for repetitively controlling certain operational parameters, for example, the luminance of a video signal may be controlled for one scene, the control reset to a starting position, and the control readjusted for a subsequent scene. Conventional control panels which employ potentiometers must manually be reset at the end of each operation to condition the control panel for a subsequent event. Needless to say, this is a tedious and time consuming activity.

One conventional control panel for a scene by scene color corrector which employs conventional rotary potentiometers avoids manual resetting. U.S. Pat. No. 4,096,523 to Belmares-Sarabia et al. discloses a control system where electromechanical means are employed to reset the control potentiometers quickly to a zero or null position in preparation for another color correction. The control potentiometers are adapted to be moved from a starting position to vary the magnitude of a color component or other control parameter. Electromagnetic positioning devices are used to reset the potentiometers to the zero or null position at the start of the next color correction, during the vertical video interval.

Another device for use in control panels which avoids manual resetting with pure electronic means is shown in U.S. Pat. No. 4,597,006 to Orsburn. In this patent, an optical position encoder mounted to the control panel provides control signals indicative of a desired increase or decrease in a controlled parameter as the operator turns a knob coupled to the shaft of the encoder. Circuitry responsive to the control signals accumulate the net increase or decrease in the controlled parameter in a memory location associated with a particular parameter. In particular, no physical movement or resetting of the encoders is required in the system shown in this patent in order to condition the control panel to accept changes for a subsequent event.

In order for the operator to monitor the amount of control being provided in the Orsburn system, a visual display on a computer monitor or on a numerical display LED or luminescent panel is provided as a control is turned. While this system conveniently allows repetitive corrections to be made without forcing tedious and repetitive manual resetting of the control knobs, the optical position encoders do not provide any position reference to the operator other than via the visual display. Although it is convenient for the operator to always begin a correction from the zero or null position, in some control situations the operator knows prior to actuating a control that significant amounts of control are desirable requiring the knob to be rotated several turns in order to approach the amount of control desired.

While the Orsburn system is certainly preferable to the electromechanical approach shown in the Belmares-Sarabia patent, there is a need for a control device wherein the operator can immediately approach the amount of control indicated virtually instantaneously and without having to turn a knob and watch a visual display. Accordingly, there is a need for a control apparatus which allows virtually instantaneous approach to the amount of control desired by an operator, while still providing the ability for instantaneous resetting to a null or zero position, for use in a computer controlled operator control panel.

SUMMARY OF THE INVENTION

The present invention provides an apparatus for controlling a controlled parameter for use in an operator control panel wherein an operator may instantaneously approach the indicated amount of control by touch. Briefly described, the present invention comprises a touch-sensitive longitudinally-extending potentiometer strip which provides an output control voltage proportional to the position of an operator's finger along the strip. The apparatus is also responsive to the touch of the operator for providing a TOUCH signal indicative that a particular potentiometer (of a possible plurality of potentiometers on a control panel) has been actuated, for convenient interface to an electronic control system such as a computer.

More particularly described, the preferred embodiment of the present invention comprises a fiberglass strip which is overlaid with a polymeric resistor film, with electrodes affixed at either end for connection to a control circuit. The control circuit comprises a balanced transformer bridge, the primary of which is excited by an AC voltage, and the secondary of which has the touch-sensitive resistor disposed between the terminals thereof. The stray body capacitance of the operator, when the resistor strip is touched, unbalances the bridge and produces an AC modulated voltage. This voltage is then passed through a synchronous demodulator which removes the AC component and provides a DC control voltage proportional to the position of touch along the strip. Removal of the operator's finger automatically returns the circuit to a balanced state and removes the control voltage, thereby rendering the potentiometer ready for a subsequent use.

Also, the voltage produced by unbalancing the bridge is provided to a means for providing a digital TOUCH signal indicative that the resistor has been touched and is therefore actuated. The TOUCH signal may be provided to a control system such as a microcomputer associated with the control panel, so that the actuated one of a plurality of potentiometers on the control panel may be selected for reading.

Accordingly, it is an object of the present invention to provide an improved touch-sensitive potentiometer for an operator control panel.

It is another object of the present invention to provide an improved apparatus for controlling parameters which is completely electronic and has no moving parts.

It is another object of the present invention to provide an improved operator control for a scene by scene color corrector system.

It is another object of the present invention to provide an improved operator control for controlling a parameter requiring repetitive manual adjustments which need not be physically returned to a starting position in preparation for a subsequent control.

It is another object of the present invention to provide an improved operator control wherein an operator may rapidly and instantaneously approach the amount of control desired without multiple turns of a control knob.

It is another object of the present invention to provide an improved operator control which is automatically conditioned for subsequent adjustments for a subsequent event without requiring physical movement or resetting of a control knob.

These and other objects, features and advantages of the present invention may be more clearly understood and appreciated from a review of the following detailed description of the preferred embodiment and by reference to the appended drawings and claims.

BRIEF DESCRIPTION OF THE DRAWINGS

FIG. 1 illustrates an operator control panel employing the preferred embodiment of the touch-sensitive control potentiometer of the present invention.

FIG. 2 is a top view of the elongate resistor strip employed in the preferred embodiment of the present invention.

FIG. 3 is an exaggerated cross-sectional view of the touch-sensitive resistor strip illustrated in FIG. 2.

FIG. 4 is a detailed schematic diagram of the circuitry associated with the preferred embodiment of the touch-sensitive control potentiometer of the present invention.

DETAILED DESCRIPTION OF THE PREFERRED EMBODIMENT

Referring now to the drawings, in which like numerals indicate like elements throughout the several views, FIG. 1 shows a typical operator control panel 12 for an electronically-or computer-controlled system such as a scene by scene color corrector or the like, employing the preferred embodiment of the touch-sensitive potentiometer 10 constructed in accordance with the present invention. A particular application of the potentiometer 10 is in a computer-controlled scene by scene color corrector such as is disclosed in application Ser. No. 604,485 to Orsburn et al. entitled "PHASE RESPONSIVE COMPOSITE VIDEO SIGNAL CONTROL SYSTEM", which is owned by the same assignee as the present invention. In particular, it is contemplated that a plurality of these touch-sensitive control potentiometers 10 will be employed in place of the optical position encoder controls employed therein. It will be understood from a review of said application that in this system, operator controls are provided for controlling the phase, amplitude, gray level, and other parameters of video signals, especially video signals produced by a motion picture telecine, video tape reproducer, or other video media.

In particular, it is specifically contemplated that the touch-sensitive potentiometers 10 will be employed to control the amplitude, phase, and gray level of a phase encoded composite video signal. Typically, an operator sitting before the control panel 12 will select a region on a color monitor (not shown) displaying a video image to be color corrected, using a track ball 14 to select a particular color of the image or a particular spatial region on the screen. Then, the operator will adjust the AMPLITUDE control to adjust the intensity of the color, the PHASE control to adjust the color by shifting the phase, and the GRAY control to adjust the luminance or gray level of the picture. By placing his or her finger on a particular one of the touch-sensitive potentiometers 10, the control computer (not illustrated) of the color correction system detects which potentiometer has been touched, and receives a digitally-encoded representation of the analog control voltage provided which corresponds to the position of the finger. The amount of control provided will be indicated on a digital display 15, although this is provided as a matter of convenience and not of necessity; the relative position of the finger on the potentiometer strip will provide immediated positional feedback to the operator.

The touch-sensitive potentiometers 10 each comprise a fiberglass or plastic substrate 20 (FIG. 3), which is preferably arranged as a longitudinally extending strip mounted to an opening 16 in the control panel 12. On top of the substrate 20 is deposited a layer of a polymeric resistor composition 22. Electrodes 24, 25 are attached at either end of the substrate 20 and are in electrical communication with the polymeric resistor film 22. In the preferred embodiment, a mylar plastic overlay 23 is placed atop the polymeric resistor film 22 in order to protect the resistor coating and also electrically insulate the operator from the electronic circuitry. It should be understood, however, that the mylar overlay 23 is optional and is not required, since the voltages employed in the circuitry are quite low and safe to the operator.

The preferred polymeric resistor film 22 is a 4200-series polymeric resistor composition manufactured by E.I. DuPont de Nemours & Co. (Inc.), Photoproducts Department, Electronic Materials Division, Wilmington, Del. 19898, preferably the type 4242. As will be understood by those skilled in the art, this composition provides 50Ω to 20KΩ per square and is suitable for screen-printing on a variety of substrates including alumina, phenolic, and epoxy printed circuit boards, mylar polyester film, and the like. The preferred resistor composition has excellent abrasion resistance and may be deposited in a low cost single step fabrication. In the preferred embodiment, it has been found that a deposited layer of about 2 mils on a ¼" fiberglass printed circuit board provides acceptable operation and provides a resistance of approximately 40 kΩ. Further information about the preferred polymeric resistor composition and the method for depositing such compositions on the substrates are available in the literature supplied by the manufacturer.

In the preferred embodiment, a plurality of 3½ inch by 3/16 inch longitudinally extending rectangular regions of polymeric resistor film are deposited in an array on a single fiberglass printed circuit board for ease of construction of the control circuitry and mounting within the control panel 12.

Turning next to FIG. 4, there is illustrated a schematic diagram of a circuit which is connected to the terminals 24, 25 of the touch-sensitive resistor film 22. The outputs of this circuit are the TOUCH signal, which is an indication that the touch-sensitive resistor has been touched, and the signal FPOT, which is a DC voltage proportional to the position of the finger along the strip.

A transformer T1 provides the basis for a balanced bridge circuit which is used to determine the value of the unknown impedance resultant when the operator touches the resistor film 22. This balanced bridge operates in a manner similar to the known linearly variable differential transformer (LVDT). An AC voltage excites the primary winding, and a voltage proportional to the position of a movable element is generated on the center tap of the secondary winding. A timer circuit 40 is employed in the preferred embodiment to excite the primary winding of the transformer T1. In the preferred embodiment, a type LM555 manufactured by National Semiconductor Corporation, Santa Clara, Calif. is employed as the timer 40, and is configured to oscillate at about 30 kHz. Although the components required to cause timer circuit 40 to oscillate at this frequency are not illustrated in FIG. 4, those skilled in the art will understand how to select appropriate timing components.

The 30 kHz signal from the timer circuit 40 is provided on line 41 to a push-pull amplifier 42 comprising transistors Q1, Q2, and Q3. This push-pull amplifier 42 is connected across the primary terminals of the transformer T1 to drive the primary winding. Transistors Q1, Q2, and Q3 are all type 2N3904. Current for the primary winding is provided from the power supply through a 10Ω resistor R1 which is connected to a center tap of the transformer. A 1 μF decoupling capacitor C1 is connected between the center tap and ground. The square wave 30 kHz signal on line 41 is provided through a 2.2 kΩ resistor R2 to the base of transistor Q1 and causes transistor Q1 to conduct when the voltage on line 41 is about five volts. The collector of Q1 is tied to the power supply through a 2.2 kΩ resistor R3, and through a 12 kΩ resistor R4 to the base of transistor Q2. The collector of Q2 is connected to one terminal of the primary of transformer T1.

In like manner, line 41 is connected through a 2.2 kΩ resistor R5 to the base of transistor Q3, whose collector is connected to the other primary terminal of transformer T1. When transistor Q1 is conducting, transistor Q2 will be off but transistor Q3 will be conducting, pulling current to ground. However, when transistors Q1 and Q3 are off, transistor Q2 will be conducting, pulling current in the opposite direction.

The secondary winding terminals of transformer T1 provide the bridge terminals. The center tap of the secondary on line 45, which is pulled up to the power supply rail of ten volts through 5.6MΩ resistor R13, is pulled down when the bridge is unbalanced. The finger-sensitive polymeric resistor 22, which is also labelled as "RF", is connected across the terminals of the secondary of the transformer T1 on lines 24, 25. A 5.6 pF capacitor C2 is connected between ground and the terminal 25 of the resistor, while a variable capacitor C3 is connected between ground and the terminal 24. Capacitor C3 is adjusted to balance the bridge so that when the operator is not touching the resistor 22, about ten volts will appear at line 45.

The operator's finger unbalances the bridge by inserting a stray capacitance CF into the circuit at a position off center and effectively serves as a "wiper" for the polymeric resistor 22. This stray capacitance results in unbalancing of the bridge, and causes a time-varying voltage to appear on line 45. Since the bridge is AC driven, the voltage component on line 45, albeit proportional to the position of the finger, normally would oscillate around a ten volt centerpoint. When the bridge is unbalanced, however, the voltage on line 45 will oscillate around a lesser voltage which is a function of the position of the finger. Accordingly, a synchronous demodulator is required to remove the AC component.

Accordingly, there is provided a synchronous demodulator circuit 50 comprising amplifiers A1, A2, and analog switch 52. Amplifier A1 and A2 are both type LF347 JFET input operational amplifiers manufactured by Motorola Semiconductor Products, Inc., Phoenix, Ariz. The signal on line 45 is provided through a 1.8MΩ resistor R6 and an AC-coupling 10 pF capacitor C5 to the noninverting terminal of amplifier A1. This noninverting terminal is pulled up to five volts through a 4.7MΩ resistor R7. The output of amplifier A1 is fed back to the inverting input to provide unity gain. The output of amplifier A1 is provided through a 2.2 kΩ resistor R8 to one input X of an analog switch 52. Also, the output of amplifier A1 is provided through a 2.2 kΩ resistor R9 to the inverting input of a second amplifier A2. The noninverting input of amplifier A2 is tied high, and the output is fed back through a 2.2 kΩ resistor R10 to the inverting input. The output of amplifier A2 is also provided through a 2.2 kΩ resistor R11 to the Y input of analog switch 52.

In the preferred embodiment, analog switch 52 is one channel of a type CD4053B CMOS analog multiplexer/demultiplexer, manufactured by RCA Corporation, Somerville, N.J. The SELECT input of the analog switch 52, which selects between the X and Y inputs, is connected on line 31 to the collector of transistor Q1. It will be appreciated that line 31 oscillates between zero and the positive power supply at 30 kHz and thus causes selection between the X and Y inputs at this rate. Because of the inversion performed by amplifier A2, it will be appreciated that the analog switch 52 essentially "flips" the negative voltage portion of the signal on line 45 to fill in between the "off" times of the square wave signal on line 31. Accordingly, the OUT signal, which is provided on line 55 from the analog switch 52, is a DC voltage which is proportional to the position of the operator's finger, plus some noise associated with operation of the circuitry.

An integrator circuit 60 is employed to average out the signal on line 55 and provide a more stable DC output. Integrator circuit 60 comprises an operational amplifier A3, also a type LF347, whose inverting input receives the signal on line 55, and whose output is fed back through integrating network R12, C7 to the noninverting input. In the preferred embodiment, R12 is 2 kΩ, while capacitor C7 is 0.1 μF. The noninverting input is connected to a resistor divider comprising resistors R15, R16, which are selected on assembly to null out the amplifier. The output of amplifier A3 is provided through a 2.2 kΩ resistor R18 and comprises the DC-voltage level FPOT, an analog voltage which varies between about zero and about five volts. Clamping diodes D1,D2 limit the excursion of the signal FPOT, so that the signal may be used by TTL input circuitry. Preferably, diodes D1,D2 are type 1N914.

Those skilled in the art will appreciate that if a digital representation of the signal FPOT is required, it is a simple matter to provide the signal to a digital-to-analog converter such as is shown generally at 62 for this purpose.

Additional circuitry is provided in FIG. 4 to signal other circuitry which employs the FPOT signal that the touch-sensitive potentiometer has been touched and is therefore providing an output voltage. Accordingly, the signal on line 45 from the center tap of the secondary winding of transformer T1 is provided to a touch signal circuit 70. Touch circuit 70 comprises a 2.7MΩ input resistor R20 connected to the inverting input of an operational amplifier A4, again a type LF347. Amplifier A4 is basically configured as an integrating comparator to detect when the bridge has become unbalanced. Accordingly, the noninverting input is connected to plus five volts, and the output is fed back through a 0.1 μF capacitor C9 to the inverting input. The output is provided through a 1 kΩ output resistor R21 and comprises the TOUCH signal, which is a positive-going five volt signal. Since touching the resistor causes line 45 to go to ground, the signal at the input of amplifier A4 will be pulled below five volts, causing an output. This output appears when the resistor 22 is touched and remains until the operator's finger is removed because of the integrating capacitor C9. Output protection diodes D3, D4, also type 1N914, are provided for output protection and excursion limitation. It will be appreciated that any circuitry which is responsive to the FPOT signal can be informed via the TOUCH signal that a valid control signal is being provided. This is particularly appropriate for computer-controlled applications such as a scene by scene color corrector, wherein the operator may desire to activate one of a plurality of similarly-configured touch-sensitive potentiometers to control a parameter such as phase, amplitude, etc.

The preferred embodiment of the present invention has been disclosed by way of example and it will be understood that other modifications may occur to those skilled in the art without departing from the scope and spirit of the appended claims.

What is claimed is:

1. Apparatus for providing a control voltage corresponding to a point along a linear strip touched by an operator, comprising:
    a longitudinally extending polymeric resistor strip formed on a substrate and exposed for touching by the operator; and
    touch responsive means connected to said resistor responsive to the operator's touch for providing a touch position signal voltage corresponding to the point on the resistor touched by the operator, said touch responsive means comprising an AC-excited bridge circuit for providing a touch received signal when said resistor is touched and a synchronous demodulator responsive to said bridge becoming unbalanced for removing AC components from said touch received signal to provide said touch position signal.

2. The apparatus of claim 1 wherein said AC-excited bridge circuit comprises a transformer bridge circuit.

3. The apparatus of claim 2, wherein said transformer bridge circuit comprises an AC-excited primary winding and a center tapped secondary winding, said resistor is connected across the terminals of said secondary winding, and wherein said center tapped secondary winding terminal provides said touch received signal.

4. The apparatus of claim 1, wherein said synchronous demodulator comprises:
    first amplifier means for amplifying said touch received signal;
    analog switch means for receiving the output of said first amplifier means and said second amplifier means and for selecting therebetween at the frequency of AC excitation of said bridge circuit.

5. The apparatus of claim 1, further comprising integrator means connected to the output of said synchronous demodulator for smoothing said touch position signal.

6. The apparatus of claim 1, further comprising touch signal means responsive to said touch received signal for providing a digital touch signal indicative that the operator has touched said resistor.

7. A control potentiometer for an operator control panel, comprising:
    an oscillator;
    a balanced transformer bridge comprising a primary winding excited by said oscillator and a center tapped secondary winding for providing a touch received signal;
    a longitudinally extending resistor strip connected between the terminals of said secondary winding, said resistor strip being exposed for touching by an operator;
    a synchronous demodulator connected to the center tap of said transformer secondary; and
    means for amplifying signals provided by said synchronous demodulator,
    whereby when the resistor strip is touched, the bridge is unbalanced and said amplifier provides a voltage corresponding to the point on the resistor strip touched by the operator.

8. The apparatus of claim 7, wherein said synchronous demodulator comprises:
    first amplifier means for amplifying said touch received signal;
    second amplifier means for inverting said touch received signal; and
    analog switch means for receiving the output of said first amplifier means and said second amplifier means and for selecting therebetween at the frequency of said oscillator.

* * * * *